(12) United States Patent
Hsu et al.

(10) Patent No.: US 11,906,897 B2
(45) Date of Patent: **\*Feb. 20, 2024**

(54) METHOD FOR EXTREME ULTRAVIOLET LITHOGRAPHY MASK TREATMENT

(71) Applicant: Taiwan Semiconductor Manufacturing Co., Ltd., Hsinchu (TW)

(72) Inventors: Pei-Cheng Hsu, Taipei (TW);
Yih-Chen Su, Taichung (TW);
Chi-Kuang Tsai, Hsinchu (TW);
Ta-Cheng Lien, Hsinchu County (TW);
Tzu Yi Wang, Hsinchu (TW);
Jong-Yuh Chang, Hsinchu County (TW); Hsin-Chang Lee, Hsinchu County (TW)

(73) Assignee: TAIWAN SEMICONDUCTOR MANUFACTURING CO., LTD., Hsinchu (TW)

(\*) Notice: Subject to any disclaimer, the term of this patent is extended or adjusted under 35 U.S.C. 154(b) by 94 days.

This patent is subject to a terminal disclaimer.

(21) Appl. No.: 17/350,685

(22) Filed: Jun. 17, 2021

(65) Prior Publication Data

US 2021/0311383 A1   Oct. 7, 2021

Related U.S. Application Data

(63) Continuation of application No. 15/956,189, filed on Apr. 18, 2018, now Pat. No. 11,048,158.

(51) Int. Cl.
G03F 1/24 (2012.01)
G03F 1/26 (2012.01)
(Continued)

(52) U.S. Cl.
CPC .................. *G03F 1/24* (2013.01); *G03F 1/26* (2013.01); *G03F 1/80* (2013.01); *G03F 1/84* (2013.01);
(Continued)

(58) Field of Classification Search
CPC ..... G03F 1/24; G03F 1/48; G03F 1/58; G03F 1/52
See application file for complete search history.

(56) References Cited

U.S. PATENT DOCUMENTS 8,980,108 B1   3/2015   Yu et al.
9,274,417 B2   3/2016   Shih et al.
(Continued)

FOREIGN PATENT DOCUMENTS

CN   101558183 A   10/2009
CN   107230672 A   10/2017
(Continued)

OTHER PUBLICATIONS

Wang, Zenglin et al., "Suppression of native oxide growth in sputtered TaN films and its application to Cu electroless plating", Journal of Applied Physics, vol. 94, No. 7, pp. 4697-4701. Oct. 1, 2003.
(Continued)

*Primary Examiner* — Daborah Chacko-Davis
(74) *Attorney, Agent, or Firm* — HAYNES AND BOONE, LLP

(57) ABSTRACT

A reflective mask includes a reflective multilayer over a substrate, a capping layer over the reflective multilayer, an absorber layer over the capping layer and including a top surface, and a protection layer directly on the top surface of the absorber layer. The absorber layer is formed of a first
(Continued)

material and the protection layer is formed of a second material that is less easily to be oxidized than the first material.

20 Claims, 9 Drawing Sheets

(51) Int. Cl.
    *G03F 7/00*     (2006.01)
    *H01L 21/263*   (2006.01)
    *G03F 1/80*     (2012.01)
    *G03F 1/84*     (2012.01)

(52) U.S. Cl.
    CPC ...... *G03F 7/70433* (2013.01); *G03F 7/70466* (2013.01); *H01L 21/2633* (2013.01)

(56) References Cited

U.S. PATENT DOCUMENTS

| | | |
|---|---|---|
| 9,535,317 B2 | 1/2017 | Hsu et al. |
| 10,866,504 B2 | 12/2020 | Lin et al. |
| 11,048,158 B2 * | 6/2021 | Hsu .................... G03F 1/26 |
| 2010/0315704 A1 | 12/2010 | Ono et al. |
| 2011/0117479 A1 | 5/2011 | Suga et al. |
| 2012/0231378 A1 | 9/2012 | Mikami et al. |
| 2016/0187770 A1 * | 6/2016 | Hsu .................... G03F 1/24 |
| | | 430/5 |
| 2019/0324364 A1 | 10/2019 | Hsu et al. |

FOREIGN PATENT DOCUMENTS

| | | |
|---|---|---|
| CN | 107452602 A | 12/2017 |
| TW | I602025 | 10/2017 |
| TW | I603142 | 10/2017 |

OTHER PUBLICATIONS

Lin, Chin-Hsiang et al., "Lithography Mask with a Black Border Region and Method of Fabricating the Same", U.S. Appl. No. 15/851,829, filed Dec. 22, 2017, 59 pages. (now U.S. Pat. No. 10,866,504).

* cited by examiner

METHOD FOR EXTREME ULTRAVIOLET LITHOGRAPHY MASK TREATMENT

PRIORITY

This is a continuation application of U.S. patent application Ser. No. 15/956,189, filed Apr. 18, 2018, herein incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, extreme ultraviolet (EUV) lithography has been utilized to support critical dimension (CD) requirements of smaller devices. EUV lithography employs scanners using radiation in the EUV region, having a wavelength of about 1-100 nm. Some EUV scanners provide 4× reduction projection printing, similar to some optical scanners, except that the EUV scanners use reflective rather than refractive optics, e.g., mirrors instead of lenses. Masks used in EUV lithography (also referred to as EUV lithography masks or EUVL masks) present new challenges. For example, EUVL masks typically include a patterned absorber layer over a reflective multilayer where the patterned absorber layer provides patterns for exposing wafers. The patterned absorber layer may easily become oxidized in ambient environment or during mask cleaning processes. This oxidation negatively affects the critical dimension on wafers exposed with the EUVL mask. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
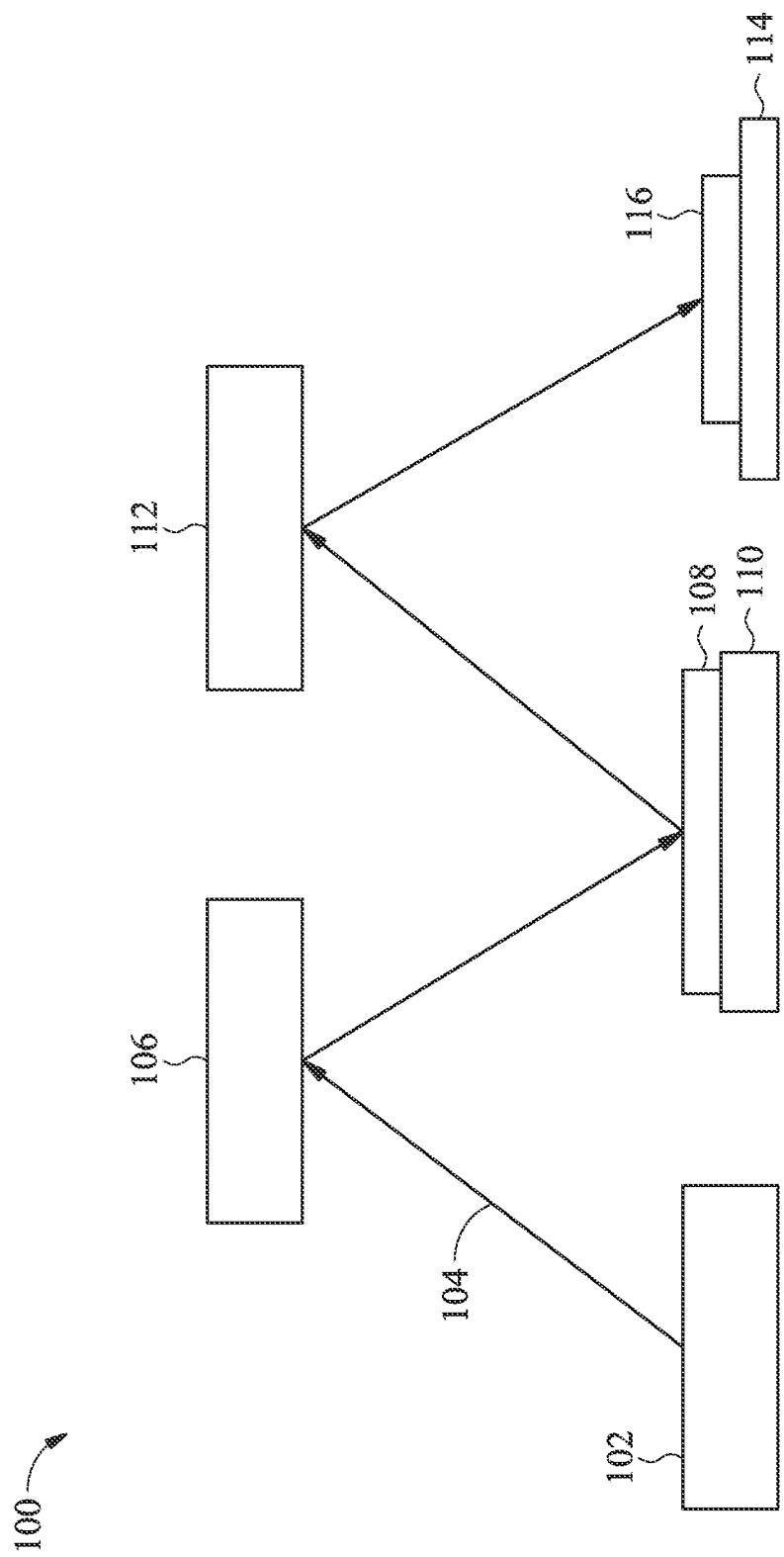
FIG. 1A is a diagram of an extreme ultraviolet (EUV) lithography exposing system that employs an EUVL mask created with embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to semiconductor device fabrication systems and methods, and more particularly related to making, using, and handling extreme ultraviolet lithography (EUVL) masks. EUVL processes have been utilized to achieve increasing functional densities and decreasing feature sizes in integrated circuits. EUVL masks are an important element in the EUVL processes. During various exposing and handling processes involving EUVL masks, particles may fall onto surfaces of the EUVL masks. Therefore, EUVL masks typically undergo various cleaning processes to ensure that their surfaces are clean. During the cleaning processes, some of the layers in the EUVL masks, such as a tantalum-containing absorber layer, may easily become oxidized. The oxidation decreases dimensions of trenches in the EUVL masks, which in turn adversely affects the critical dimension of patterns on wafers imaged with the EUVL masks. The present disclosure provides embodiments of methods that address these issues.

FIG. 1A shows an exemplary EUV lithography system 100 that benefits from one or more embodiments of the present disclosure. The system 100 includes a radiation source 102 that produces a radiation beam 104, condenser optics 106, an EUVL mask 108 on a mask stage 110, projection optics 112, and a substrate 116 on a substrate stage 114. Particularly, the EUVL mask 108 is treated with one or more chemical elements to prevent or reduce oxidation of the absorber layer therein, according to aspects of the present disclosure. Other configurations and inclusion or omission of items may be possible. In the present disclosure, the system 100 may be a stepper or a scanner. The elements of the system 100 are further described below.

The radiation source 102 provides the radiation beam 104 having a wavelength in the EUV range, such as about 1-100 nm. In an embodiment, the radiation beam 104 has a wavelength of about 13.5 nm. The condenser optics 106 includes a multilayer coated collector and a plurality of grazing mirrors. The condenser optics 106 is configured to collect and shape the radiation beam 104 and to provide a slit of the radiation beam 104 to the EUVL mask 108.

The EUVL mask 108, also referred to as a photomask or a reticle, includes patterns of one or more target IC devices. The mask 108 provides a patterned aerial image to the radiation beam 104. In the present embodiment, the mask 108 is a reflective mask which will be described in further detail below with reference to FIG. 1B. Particularly, some surfaces of the EUVL mask 108 are treated with one or more elements that prevent or retard oxidation of those surfaces. This enhances the accuracy of the pattern transfer by the EUV lithography system 100 and increases the reusability of the EUVL mask 108. The EUVL mask 108 may incorporate resolution enhancement techniques such as phase-shifting mask (PSM) and/or optical proximity correction (OPC). The mask stage 110 secures the EUVL mask 108 thereon, such as by vacuum, and provides accurate position and movement of the EUVL mask 108 during alignment, focus, leveling and exposure operation in the EUV lithography system 100.

The projection optics 112 includes one or more lens and a plurality of mirrors. The lens may have a magnification of less than one thereby reducing the patterned aerial image of the EUVL mask 108 to the substrate 116.

The substrate 116 includes a semiconductor wafer with a photoresist (or resist) layer, which is sensitive to the radiation beam 104. The substrate 116 is secured by the substrate stage 114 which provides accurate position and movement of the substrate 116 during alignment, focus, leveling and exposing operation in the EUV lithography system 100 such that the patterned aerial image of the EUVL mask 108 is exposed onto the substrate 116 in a repetitive fashion (though other lithography methods are possible).

After the substrate 116 is exposed to the radiation beam 104, it is moved to a developer where areas of the photoresist layer of the substrate 116 are removed based on whether the area is exposed to the radiation beam 104, thereby transferring the patterns from the mask 108 to the substrate 116. In some embodiments, a developer includes a water based developer, such as tetramethylammonium hydroxide (TMAH), for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying a developer on the exposed resist film, for example, by a spin-on process. Applying a developer also includes using a post exposure bake (PEB) process, a post develop bake (PDB) process, or a combination thereof. The developed or patterned photoresist layer is used for further processing the substrate 116 in order to form the target IC device. For example, one or more layers of the substrate 116 may be etched with the patterned photoresist layer as an etch mask.

Figure 1B:
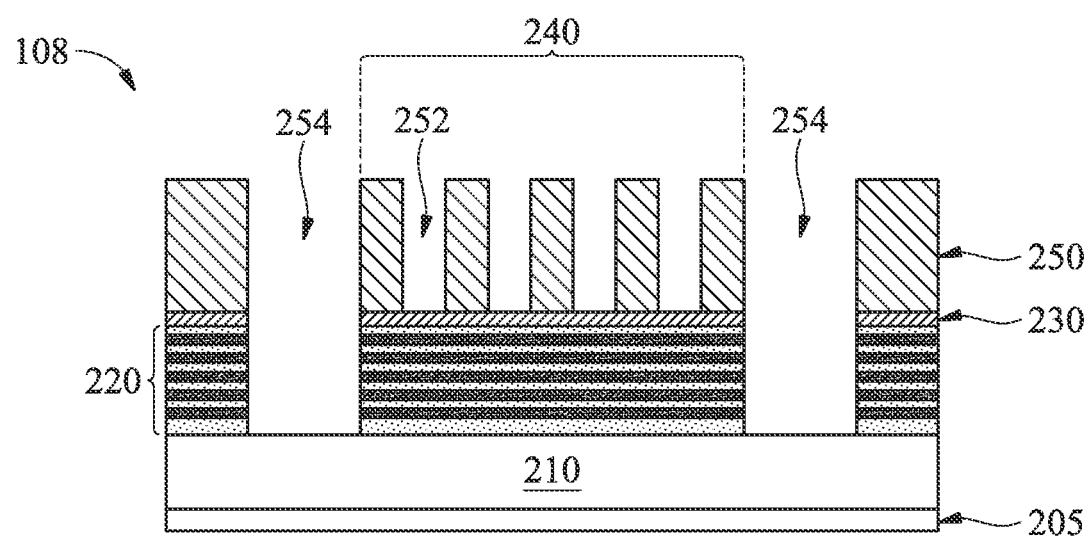
FIG. 1B illustrates a cross-sectional view of an EUVL mask, in accordance with an embodiment.

Referring to FIG. 1B, shown therein is a cross-sectional view of an embodiment of the EUVL mask 108, in portion, constructed and treated according to embodiments of the present disclosure. Particularly, some surfaces of the EUVL mask 108 are implanted with one or more elements such as nitrogen that prevent or retard oxidation of those surfaces. The EUVL mask 108 includes a substrate 210, a reflective multilayer (ML) 220 deposited over the substrate 210, a capping layer 230 deposited over the reflective ML 220, an absorber layer 250 deposited over the capping layer 230, and a conductive layer 205 under the substrate 210 for electrostatic chucking purposes. In an embodiment, the EUVL mask 108 may further include a protection layer (not shown) deposited over the absorber layer 250. Other configurations and inclusion or omission of various items in the EUVL mask substrate 108 may be possible.

In an embodiment, the conductive layer 205 includes chromium nitride (CrN). In another embodiment, the conductive layer 205 includes a tantalum boride such as TaB. The substrate 210 includes low thermal expansion material (LTEM), serving to minimize image distortion due to mask heating by intensified EUV radiation. The LTEM may include fused silica, fused quartz, calcium fluoride ($CaF_2$), silicon carbide, silicon oxide-titanium oxide alloy and/or other suitable LTEM.

The reflective multilayer (ML) 220 includes a plurality of film pairs, such as molybdenum-silicon (Mo/Si) film pairs (e.g., a layer of molybdenum above or below a layer of silicon in each film pair). Alternatively, the ML 220 may include molybdenum-beryllium (Mo/Be) film pairs, or any two materials or two material combinations with large difference in refractive indices and small extinction coefficients. The thickness of each layer of the ML 220 depends on the wavelength and an incident angle of the EUV radiation 104 (FIG. 1A). For a specified incident angle, the thickness of each layer of the ML 220 may be adjusted to achieve maximal constructive interference for radiations reflected at different interfaces of the ML 220. A typical number of film pairs are 20-80, however any number of film pairs are possible. In an embodiment, the ML 220 includes 40 pairs of layers of Mo/Si. Each Mo/Si film pair has a thickness of about 7 nm, e.g., about 3 nm for Mo and about 4 nm for Si. In this case, a reflectivity of about 70% is achieved.

The capping layer 230 is selected to have different etching characteristics from the absorber layer 250 and acts as an etching stop layer in a patterning or repairing process of the absorber layer 250. In the present embodiment, the capping layer 230 includes ruthenium (Ru) or Ru compounds such as ruthenium-boron (RuB), ruthenium-silicon (RuSi), or ruthenium nitride (RuN). The absorber layer 250 includes a material that absorbs the EUV radiation beam 104 projected thereon. The absorber layer 250 may include a single layer or multiple layers of materials selected from chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), or other suitable materials. In some embodiments, the absorber layer 250 includes a layer of tantalum boron oxide (TaBO) (e.g., 2 nm to 20 nm thick) as an anti-reflective layer over a layer of tantalum boron nitride (TaBN). In the present embodiment, surface portions of the absorber layer 250 include a layer of material that is implanted with one or more elements for preventing the absorber layer 250 from oxidation. For example, the surface portions of the absorber layer 250 may be implanted with nitrogen. To further this example, the absorber layer 250 may include a thin layer of tantalum boron nitride (TaBN) covering a main layer of TaBO or $Ta_2O_5$.

One or more of the layers 205, 220, 230, and 250 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods.

Still referring to FIG. 1B, the layers 220, 230, and 250 are patterned with one or more photolithography processes (to be discussed later) to form various trenches 252 and 254. Particularly, trenches 252 are located in a circuit pattern area 240, and trenches 254 are located in a die boundary area that surrounds the circuit pattern area 240.

Figure 2:
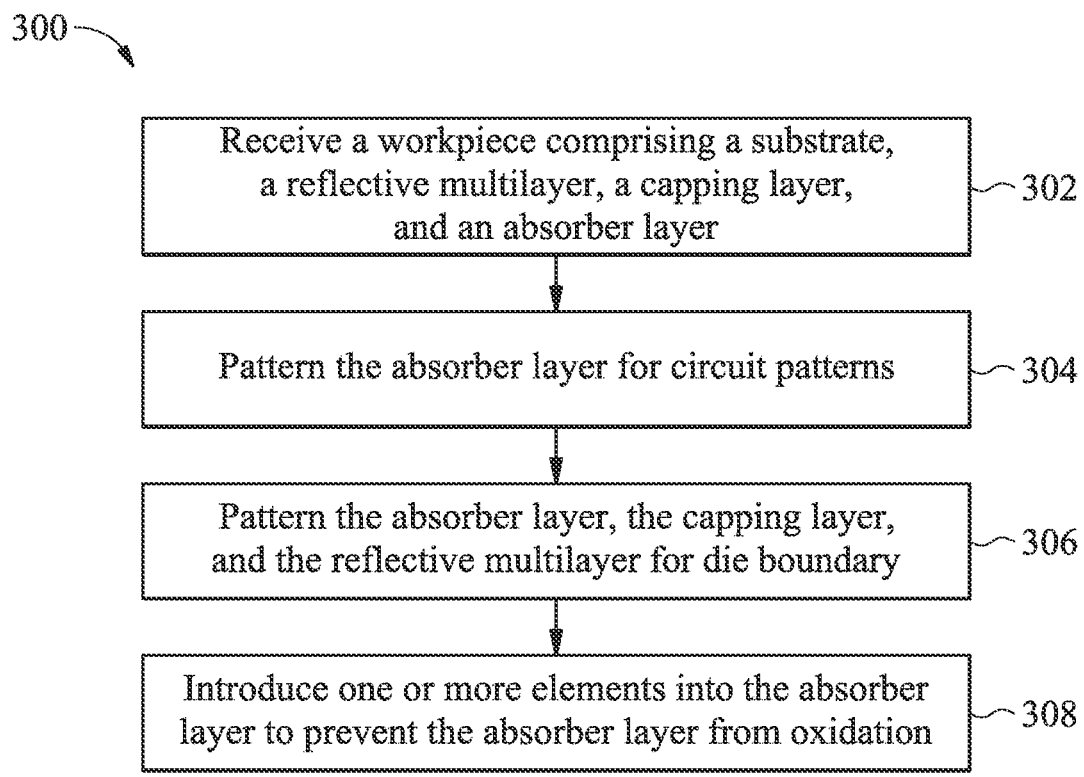
FIG. 2 shows a flowchart of a method of making EUVL masks according to various aspects of the present disclosure.

FIG. 2 shows a flow chart of a method 300 of making an EUVL mask, such as the EUVL mask 108, according to various aspects of the present disclosure. The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 3A-3I which are cross-sectional views of the EUVL mask 108 in various stages of a manufacturing process.

Figure 3A:
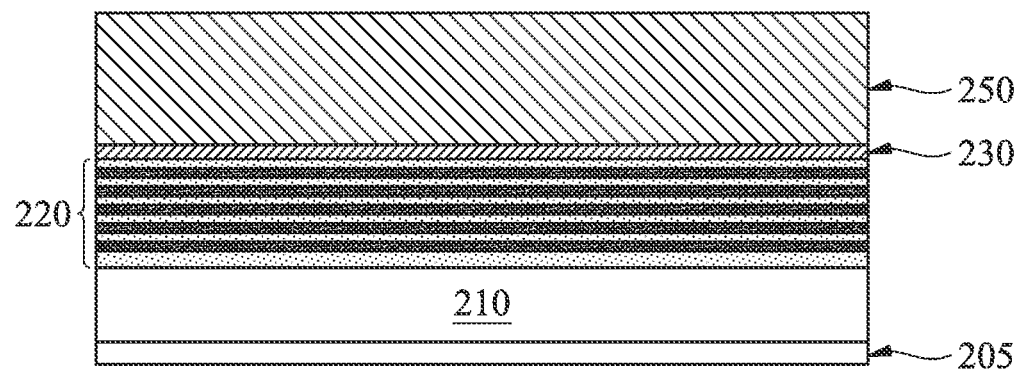
FIGS. 3A, 3B, 3C, 3D, 3E, 3F, 3G, 3H, and 3I illustrate cross-sectional views of an embodiment of an EUVL mask during various stages of fabrication according to various aspects of the present disclosure.

At operation 302, the method 300 (FIG. 2) receives a workpiece 200 such as shown in FIG. 3A. Referring to FIG. 3A, the workpiece 200 includes a substrate 210 and various layers 205, 220, 230, and 250 formed on surfaces of the substrate 210. Particularly, the layer 205 is deposited on a surface of the substrate 210 opposite another surface of the substrate 210 where the layers 220, 230, and 250 are deposited. The materials for the substrate 210 and the layers 205, 220, 230, and 250 have been discussed with reference to FIG. 1B except that the layer 250 has not been implanted with the oxidation-retarding element(s). Particularly, the layer 205 is a conductive layer and may include CrN or TaB, the layer 220 is a reflective multilayer, the layer 230 is a capping layer and may include ruthenium or ruthenium nitride, and the layer 250 is an absorber layer and may include tantalum.

At operation 304, the method 300 (FIG. 2) patterns the absorber layer 250 to produce circuit patterns thereon. This includes a variety of processes including coating a photoresist layer over the absorber layer 250, exposing the photoresist layer, developing the photoresist layer to form photoresist patterns, etching the absorber layer 250 using the photoresist patterns as an etch mask, and removing the photoresist patterns. The details of the operation 304 are further illustrated in FIGS. 3B through 3D.

Figure 3B:
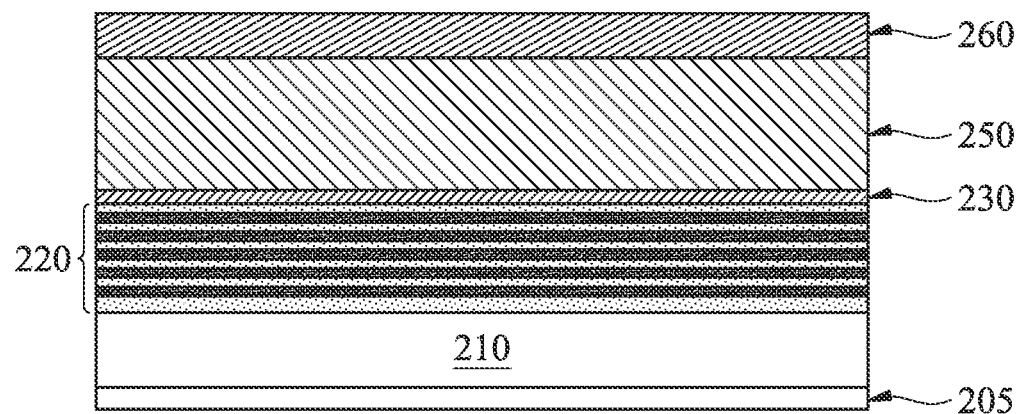

Referring to FIG. 3B, a photoresist layer 260 is formed over the absorber layer 250, for example, by a spin coating process. The photoresist layer 260 is sensitive to electron beams in the present embodiment. The photoresist layer 260 may be a positive photoresist or a negative photoresist, and may be coated to any suitable thickness.

Figure 3C:
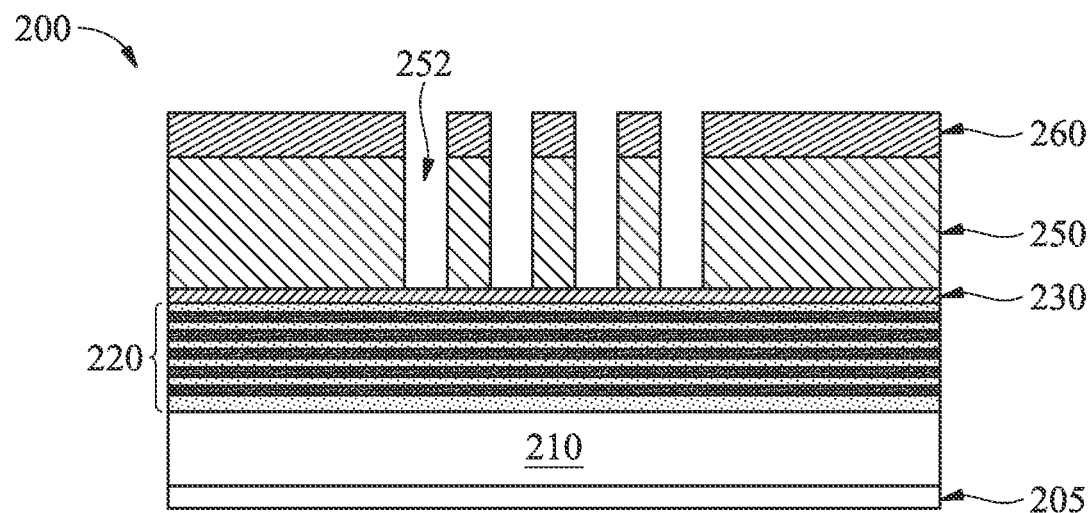

Referring to FIG. 3C, the photoresist layer 260 is exposed to a patterned electron beam, and is subsequently developed to form trenches 252. The exposed photoresist layer 260 may be developed by a positive tone development (PTD) process or by a negative tone development (NTD) process.

In a PTD process, portions of the photoresist layer 260 that are exposed to the electron beams are dissolved in a developer and removed, leaving the trenches 252 in the photoresist layer 260. In an NTD process, portions of the photoresist layer 260 that are not exposed to the electron beams are dissolved in a developer and removed, leaving the trenches 252 in the photoresist layer 260. After the photoresist layer 260 has been developed to form resist patterns, the absorber layer 250 is etched using the resist patterns as an etch mask to thereby extend the trenches 252 into the absorber layer 250.

Figure 3D:
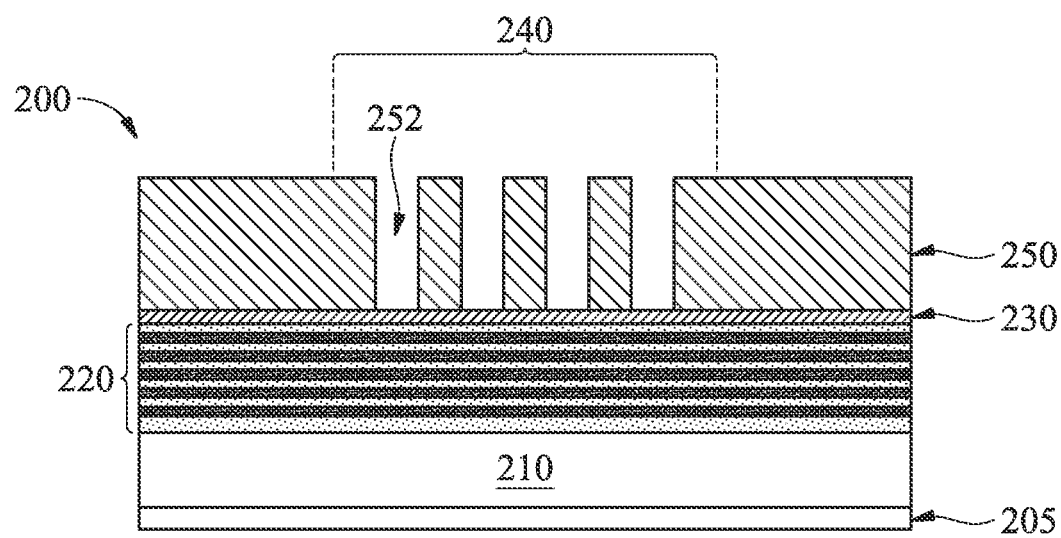

Referring to FIG. 3D, the resist pattern 260 is removed from the workpiece 200, for example, using resist stripping. After the processes shown in FIGS. 3B-3D, a circuit pattern 240 is formed in the absorber layer 250. For example, the circuit pattern 240 may correspond to one layer in an IC die. The layer may include active regions, gate structures, vias, metal structures, or other suitable circuit features.

At operation 306, the method 300 (FIG. 2) patterns the absorber layer 250, the capping layer 230, and the reflective ML 220 to form trenches corresponding to a die boundary area. This includes a variety of processes including coating a photoresist layer over the workpiece 200, exposing the photoresist layer, developing the photoresist layer to form photoresist patterns, etching the various layers 250, 230, and 220 using the photoresist patterns as an etch mask, and removing the photoresist patterns. The details of the operation 306 are further illustrated in FIGS. 3E through 3G.

Figure 3E:
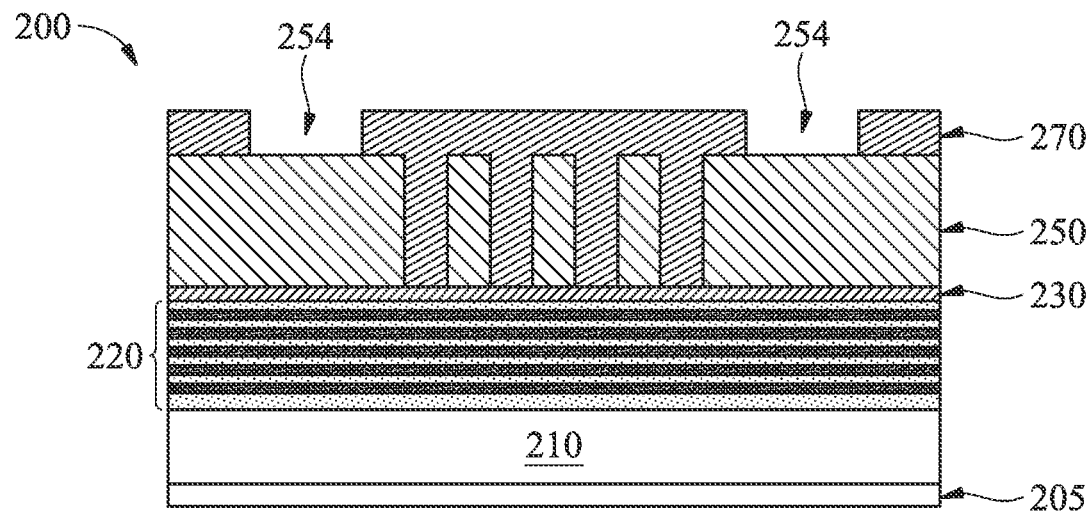

Referring to FIG. 3E, another photoresist layer 270 is formed over the workpiece 200 (e.g., by spin coating), and is patterned to form openings 254 in the photoresist layer 270. The photoresist layer 270 is sensitive to electron beams in the present embodiment. The photoresist layer 270 may be a positive photoresist or a negative photoresist. Patterning the photoresist layer 270 includes exposing the photoresist layer 270 to a patterned electron beam, and developing the photoresist layer 270 in a suitable developer in either a PTD process or an NTD process. In the present embodiment, the trenches 254 correspond to areas of a wafer between IC dies, which are referred to as die boundary area in the present disclosure. In other words, the trenches 254 do not correspond to circuit patterns, but rather surround circuit patterns.

Figure 3F:
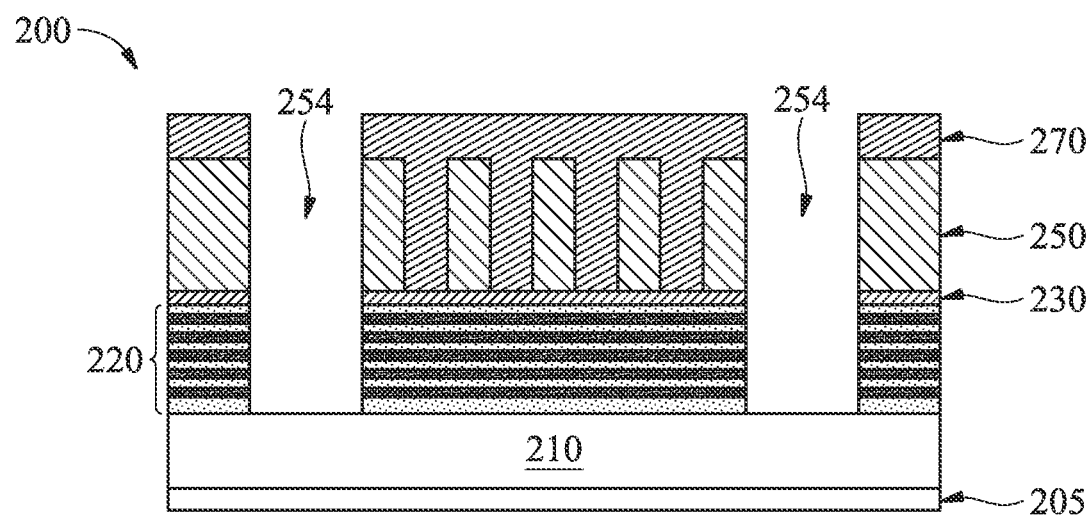

Referring to FIG. 3F, in this example, the absorber layer 250, the capping layer 230, and the reflective ML 220 are etched using the patterned photoresist layer 270 as an etch mask, thereby extending the trenches 254 into the workpiece 200. The trenches 254 expose the top surface of the substrate 210. In some embodiments, the trenches 254 help reduce or eliminate field-to-field interference during wafer imaging.

Figure 3G:
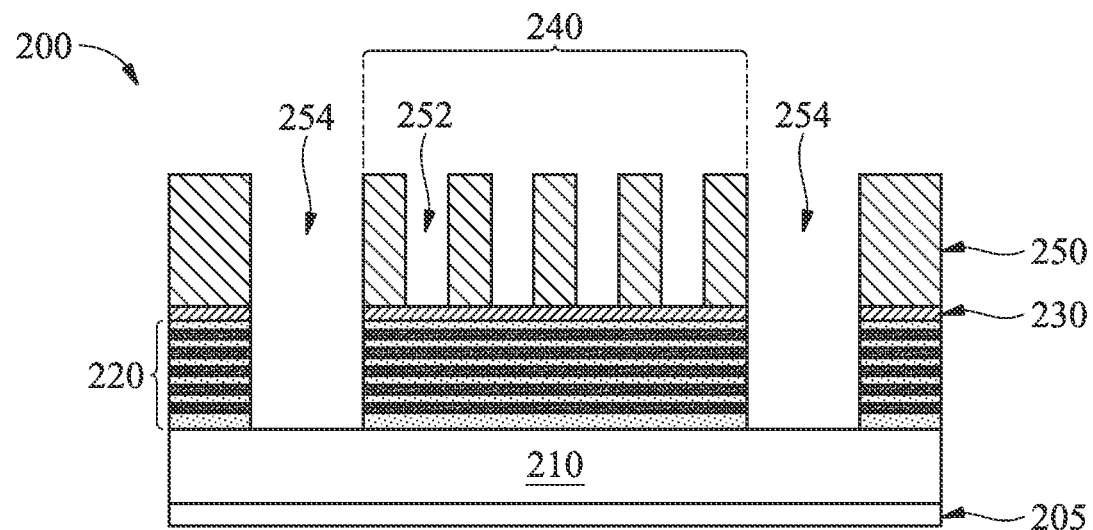

Referring to FIG. 3G, the patterned photoresist layer 270 is removed, for example, by resist stripping. That leaves the patterned layers 220, 230, and 250 over the substrate 210. Particularly, the patterned layers 220, 230, and 250 provide the trenches 252 and 254. The trenches 252 and the patterned absorber layer 250 correspond to the circuit pattern 240. The trenches 254 correspond to a die boundary area. Through the trenches 252 and 254, various surfaces of the layers 222, 230, and 250 are exposed. Particularly, various surfaces of the absorber layer 250 are exposed. In some embodiments, the absorber layer 250 includes tantalum, titanium, chromium, palladium, molybdenum, or other elements. Some of the elements in the absorber layer 250 tend to be oxidized in oxygen ambient or during cleaning processes using oxidizers. For example, the absorber layer 250 may include tantalum or tantalum boride, which may easily react with oxygen to form tantalum pentoxide ($Ta_2O_5$) or tantalum boron oxide (TaBO). Once oxidized, the lateral (or horizontal) dimension of the absorber layer 250 increases and the lateral dimension of the trench 252 decreases. This would cause the critical dimensions of the circuit patterns on the wafer (e.g., wafer 116) to be out of specification, leading to manufacturing defects. To prevent this from happening, the method 300 performs operation 308 to treat the various exposed surfaces of the workpiece 200.

Figure 3H:
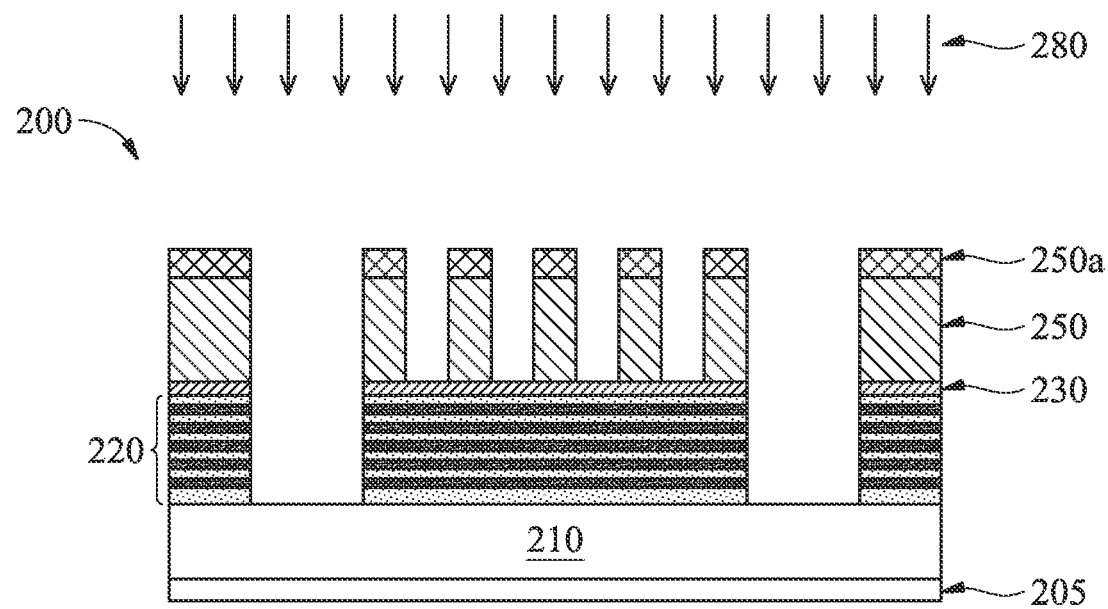

At the operation 308, the method 300 (FIG. 2) introduces one or more chemical elements into various exposed surfaces of the workpiece 200 to prevent them from oxidation. Referring to FIG. 3H, chemical elements 280 are applied to the workpiece 200. In an embodiment, the chemical elements 280 include ion species with atomic number less than 15. Having a smaller atomic number makes it easier for the chemical elements 280 to diffuse into the various layers in the workpiece 200, particularly the patterned absorber layer 250. Furthermore, the ion species in the chemical elements 280 are selected so that they may form compound(s) with materials of the absorber layer 250 (and optionally the capping layer 230) where the compound(s) are not easily oxidized, thereby increasing the durability of the absorber layer 250 (and optionally the capping layer 230) against subsequent cleaning processes. In an embodiment, the chemical elements 280 include fluorine (F) (or fluorine ions). For example, fluorine and tantalum may form tantalum fluoride ($TaF_5$), which is not easily oxidized during cleaning processes. In another embodiment, the chemical elements 280 include nitrogen (or nitrogen ions). For example, nitrogen and tantalum may form tantalum nitride (TaN) or nitrogen rich tantalum oxynitride (TaON), which is not easily oxidized during cleaning processes. In embodiments, fluorine and/or nitrogen ions may be introduced into surfaces of the absorber layer 250 (and optionally the capping layer 230) using ion implantation in an ion implanter or applying plasma in an etching chamber. In some embodiments, the absorber layer 250 may already include certain amount of nitrogen prior to the operation 308. In these embodiments, the operation 308 may further increase nitrogen contents in the surface portion of the absorber layer 250.

In some embodiments, the operation 308 applies nitrogen plasma to the workpiece 200 with a source power ranging from 350 to 1,000 Watts, a pressure ranging from 1 to 10 mtorr, and for duration ranging from 30 seconds to 120 seconds. Nitrogen gas may be introduced into the process chamber at a flow rate ranging from 80 to 120 sccm. In the present embodiment, the nitrogen plasma is applied with a bias power substantially equal to 0 such that the capping layer 230 is substantially not altered by the nitrogen plasma. A bias power much greater than 0 might damage the capping layer 230 which includes ruthenium in the present embodiment.

Figure 3I:
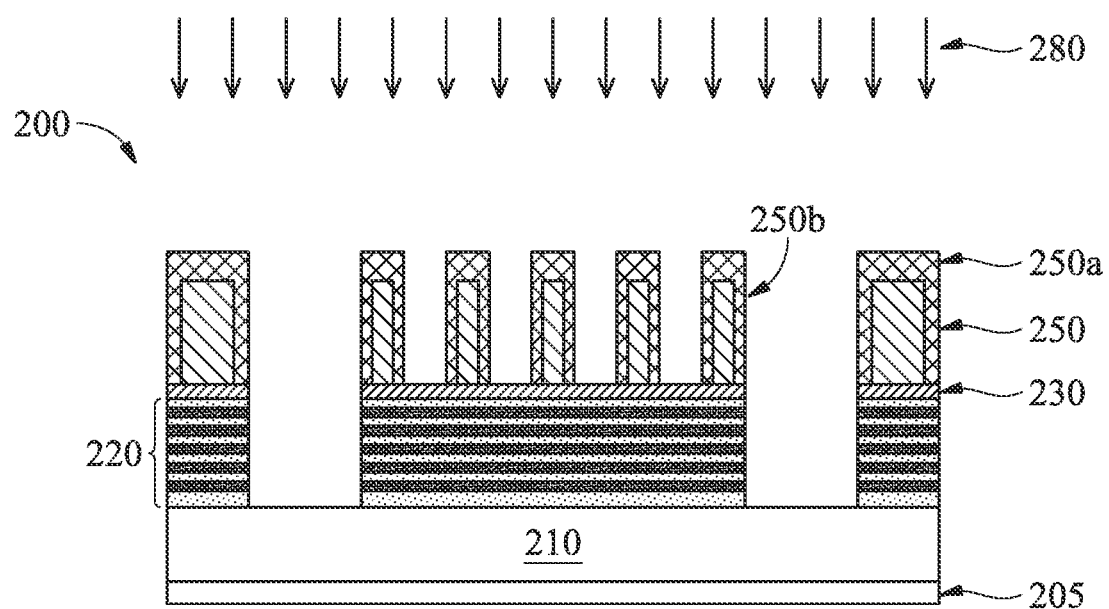

In various embodiments, after the operation 308, the surface portion of the absorber layer 250 includes elevated nitrogen content (or elevated fluorine content if fluorine ions are introduced therein). As illustrated in FIG. 3H, as a result of the operation 308, the top surface portion 250a of the absorber layer 250 includes elevated nitrogen contents. In some embodiments, the top surface portion 250a may have a thickness ranging from 2 to 10 nm thick, such as from 5 to 8 nm thick. For example, a ratio of nitrogen to tantalum (N:Ta) in the surface portion 250a of the absorber layer 250 is tuned to be equal to or greater than 1.25. In some other embodiments as illustrated in FIG. 3I, nitrogen contents are introduced not only to the top surface portion 250a, but also into the sidewall surfaces of the absorber layer 250 to form a sidewall surface portion 250b having elevated nitrogen contents. In some embodiments, the sidewall surface portion 250b may have a smaller thickness than the top surface portion 250a. Further, the sidewall surface portion 250b may have a lower nitrogen to tantalum ratio than the top surface portion 250a. In some embodiments, the operation 308 are tuned such that the nitrogen to tantalum ratio in both the top surface portion 250a and the sidewall surface portion 250b to be equal to or greater than 1.25. Even though not shown, the chemical elements 280 may also be introduced into the capping layer 230, the reflective ML 220, and the substrate 210.

Experiments have shown that when the ratio N:Ta is equal to or greater than 1.25, the treated surfaces of the absorber layer 250 are less likely to be oxidized. For example, the oxidation rate of these treated surfaces is negligible, such as below 0.4 nm per day in oxygen ambient. Furthermore, experiments have shown that applying nitrogen plasma to EUVL masks do not negatively impact the imaging quality of the EUVL masks (such as CD and CD uniformity of wafer patterns).

After the treatment by the operation 308, the workpiece 200 provides an EUVL mask, such as the EUVL mask 108. The EUVL mask includes the substrate 210 and the patterned layers 220, 230, and 250. Particularly, surfaces of the patterned absorber layer 250 (and optionally surfaces of the capping layer 230) are treated with one or more oxidation-retarding chemical elements, such as nitrogen. The treatment advantageously increases the lifetime of the EUVL mask.

Figure 4:
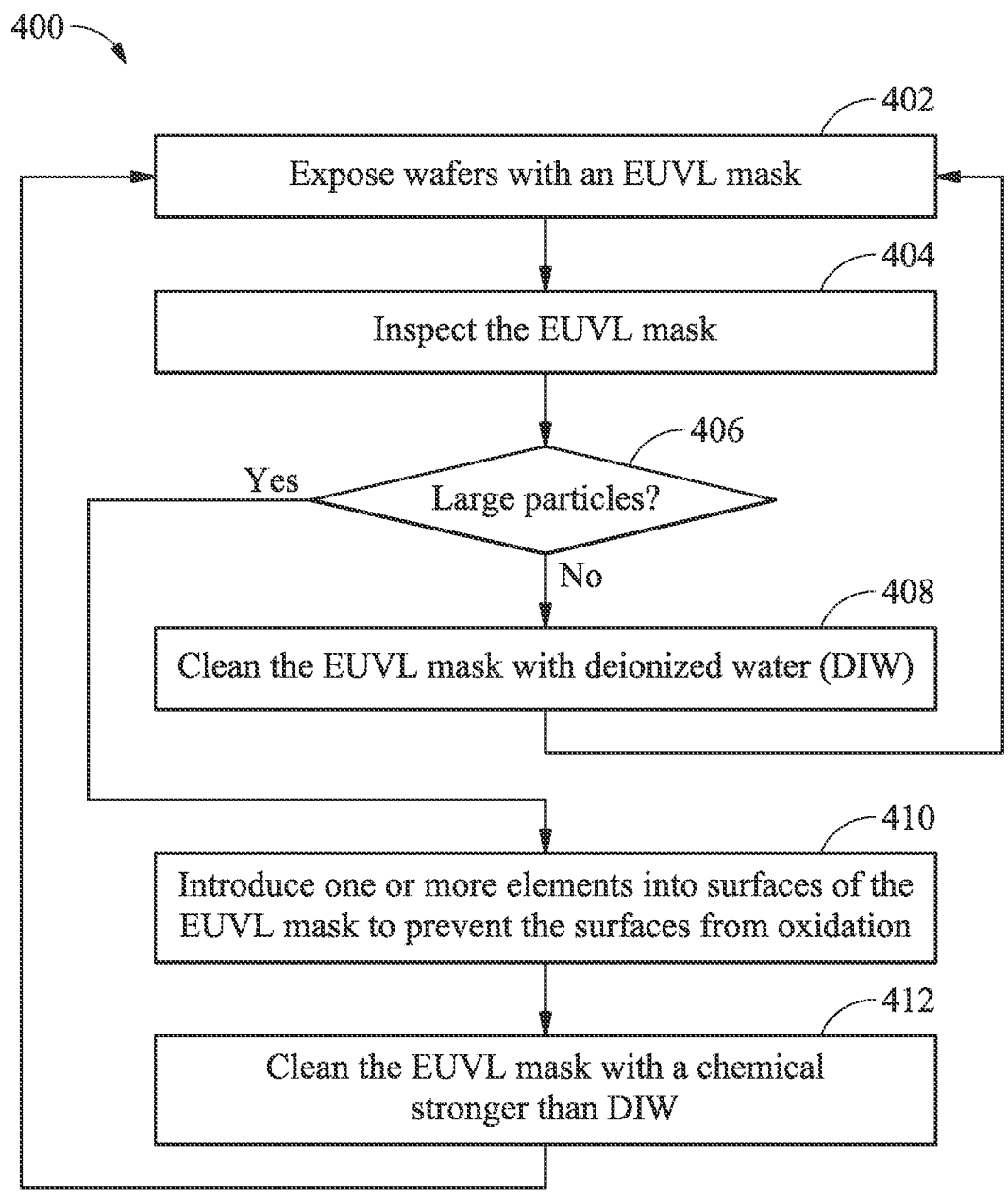
FIG. 4 shows a flowchart of a method of using, cleaning, and treating EUVL masks according to various aspects of the present disclosure.

FIG. 4 shows a flow chart of a method 400 of using and handling EUVL masks, such as the EUVL mask 108, according to various aspects of the present disclosure. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method.

At operation 402, the method 400 uses the EUVL mask to expose one or more wafers. For example, the operation 402 may be performed with the EUV lithography system 100 of FIG. 1A, where the EUVL mask 108 is used to expose one or more substrates 116 including wafers. During various exposure processes, particles or contaminants may fall onto (or otherwise become attached to) the surfaces of the EUVL mask. For example, particles may form from photoresist outgassing. These particles may adversely affect the imaging effects of the exposing process and may introduce defects into the circuit patterns formed on the wafers. Therefore, these particles must be removed, for example, by applying one or more cleaning processes to the EUVL mask.

At operation 404, the method 400 inspects surfaces of the EUVL mask to detect particles thereon. For example, the inspection may be performed using an optical scanning inspection tool, an atomic force microscopy (AFM), a photomask registration and overlay metrology tool, or other suitable inspection tools.

If the operation 404 finds any particles, the method 400 further compares the size of the particles with a predefined size threshold in operation 406. If the size of the particles is equal to or less than the predefined size threshold, the method 400 proceeds to operation 408 to clean the EUVL mask with deionized water (DIW). On the other hand, if the size of the particles is greater than the predefined size threshold, using DIW is no longer effective in removing them, and the method 400 proceeds to operation 410 to treat the EUVL mask before cleaning it with a chemical that is stronger than DIW (for example, having stronger oxidizing power than DIW).

At operation 410, the method 400 introduces one or more chemical elements into surfaces of the EUVL mask, particularly surfaces of a patterned absorber layer of the EUVL mask. The operation 410 may be performed in the same (or similar) manner as the operation 308 discussed above. For example, the operation 410 may introduce nitrogen into the surfaces of the EUVL mask using an ion implanter or an etcher, such as by applying nitrogen plasma to the EUVL mask. In a particular embodiment, the operation 410 introduces nitrogen into a tantalum-containing absorber layer of the EUVL mask such that the ratio of N:Ta in a surface portion of the absorber layer becomes equal to or greater than 1.25. Experiments have shown that by introducing nitrogen into the absorber layer, the absorber layer becomes less likely oxidized in the subsequent cleaning processes with a strong cleaning chemical.

At operation 412, the method 400 cleans the EUVL mask with a chemical stronger than DIW (for example, having stronger oxidizing power than DIW). For example, the chemical may include hydrogen peroxide ($H_2O_2$), a sulfuric acid, a hydrogen fluoride acid, a sulfuric peroxide mixture (SPM) in either warm temperature (about 90° C.) or cold temperature (much lower than 90° C., such as 20° C. to 30° C.), or other suitable chemicals effective in removing the large particles identified in the operations 404 and 406. Since various surfaces of the EUVL mask have been pre-treated in the operation 410, these surfaces have negligible oxidation rate during the operation 412. Without the treatment of the operation 410, some surfaces of the EUVL mask might easily form oxidation, degrading the imaging quality of the EUVL mask. Also, over time, the repeated oxidation might render the EUVL mask unusable. Advantageously, the treatment by the operation 410 coupled with the cleaning operation 412 improve the imaging quality of the EUVL mask and extend the lifetime of the EUVL mask.

After cleaning the EUVL mask in either operation 408 or the operation 412, the method 400 may perform further exposure processes using the EUVL mask in the operation 402.

Although not intended to be limiting, one or more embodiments of the present disclosure provide many benefits to semiconductor fabrication processes. For example, embodiments of the present disclosure provide a treatment process to EUVL masks during mask making processes or during mask handling processes. The treatment process increases the durability of the EUVL masks against various cleaning processes without negatively impacting the imaging quality of the EUVL masks.

In one exemplary aspect, the present disclosure is directed to a method. The method includes receiving a workpiece that includes a substrate having a low temperature expansion material, a reflective multilayer over the substrate, a capping layer over the reflective multilayer, and an absorber layer over the capping layer the method further includes first patterning the absorber layer to provide first trenches corresponding to circuit patterns on a wafer, and second patterning the absorber layer, the capping layer, and the reflective multilayer to provide second trenches corresponding to a die boundary area on the wafer, thereby providing an extreme ultraviolet lithography (EUVL) mask. The method further includes treating the EUVL mask with one or more chemical elements that prevent exposed surfaces of the absorber layer from oxidation.

In an embodiment of the method, the treating of the EUVL mask includes applying nitrogen plasma to the EUVL mask. In a further embodiment, the nitrogen plasma is applied with a bias power substantially equal to 0. In another further embodiment, the absorber layer comprises tantalum (Ta), and the applying of the nitrogen plasma to the EUVL mask results in a ratio of N to Ta (N:Ta) in a surface layer of the absorber layer to be greater than or equal to 1.25.

In an embodiment of the method, the one or more chemical elements include fluorine. In an embodiment, the method further includes exposing one or more wafers with the EUVL mask and cleaning the EUVL mask with deionized water (DIW). In a further embodiment, the method further includes inspecting surfaces of the EUVL mask, and on condition that the surfaces of the EUVL mask are found to have particles bigger than a size threshold, treating the EUVL mask with the one or more chemical elements, and cleaning the EUVL mask with another cleaning chemical that provides stronger oxidizing power than DIW. In an embodiment, the another cleaning chemical comprises hydrogen peroxide, sulfuric acid, hydrogen fluoride acid, or a sulfuric peroxide mixture.

In an embodiment of the method, each of the first patterning and the second patterning includes coating a photoresist layer over the workpiece; exposing the photoresist layer using electron beam; developing the photoresist layer to form photoresist patterns; and etching the workpiece with the photoresist patterns as an etch mask.

In another exemplary aspect, the present disclosure is directed to a method. The method includes receiving a workpiece that includes a substrate having a low temperature expansion material, a reflective multilayer over the substrate, a capping layer having ruthenium over the reflective multilayer, and an absorber layer having tantalum over the capping layer. The method further includes patterning the absorber layer, the capping layer, and the reflective multilayer to provide first trenches corresponding to circuit patterns on a wafer and second trenches corresponding to a die boundary area on the wafer, thereby providing an extreme ultraviolet lithography (EUVL) mask. The method further includes treating the EUVL mask with nitrogen plasma.

In an embodiment of the method, the nitrogen plasma is applied with a bias power substantially equal to 0 such that the capping layer is substantially not altered by the nitrogen plasma. In another embodiment, the nitrogen plasma is applied with duration ranging from 30 seconds to 120 seconds, source power ranging from 350 Watts to 1000 Watts, and pressure ranging from 1 mtorr to 10 mtorr. In yet another embodiment, the nitrogen plasma is applied in a manner to produce a surface layer of the absorber layer to have a ratio of N to Ta (N:Ta) greater than or equal to 1.25.

In an embodiment, the method further includes exposing one or more wafers with the EUVL mask; inspecting surfaces of the EUVL mask; and on condition that the surfaces of the EUVL mask are found to have particles larger than a size threshold, treating the EUVL mask with second nitrogen plasma.

In a further embodiment, after the treating of the EUVL mask with the second nitrogen plasma, the method further includes cleaning the EUVL mask with a cleaning chemical that provides stronger oxidizing power than deionized water (DIW). In an embodiment, the cleaning chemical comprises hydrogen peroxide, sulfuric acid, hydrogen fluoride acid, or a sulfuric peroxide mixture.

In another further embodiment, after the inspecting of the surfaces of the EUVL mask and on condition that the surfaces of the EUVL mask are found not to have particles larger than the size threshold, the method further includes cleaning the EUVL mask with deionized water (DIW).

In yet another exemplary aspect, the present disclosure is directed to a method. The method includes exposing one or more wafers with an extreme ultraviolet lithography (EUVL) mask; inspecting surfaces of the EUVL mask; on condition that the surfaces of the EUVL mask are found to have particles larger than a size threshold, treating the EUVL mask with nitrogen plasma; and after the treating of the EUVL mask with the nitrogen plasma, cleaning the EUVL mask with a cleaning chemical including hydrogen peroxide, sulfuric acid, hydrogen fluoride acid, or a sulfuric peroxide mixture.

In an embodiment, after the inspecting of the surfaces of the EUVL mask and on condition that the surfaces of the EUVL mask are found not to have particles larger than the size threshold, the method further includes cleaning the EUVL mask with deionized water (DIW).

In an embodiment of the method, the EUVL mask includes an absorber layer comprising tantalum (Ta), and the treating of the EUVL mask with the nitrogen plasma is applied in a manner to result in a ratio of N to Ta (N:Ta) in a surface layer of the absorber layer to be greater than or equal to 1.25.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
a substrate; and
a first stack of multiple layers disposed over the substrate and comprising:
a first reflective multilayer over the substrate,
a first capping layer over the first reflective multilayer,
a first absorber layer over the first capping layer, wherein the first absorber layer includes a first material and comprises a top surface, and
a first protection layer disposed directly on the top surface of the first absorber layer and includes a second material,
wherein a ratio of nitrogen to tantalum (N/Ta) in the first protection layer is greater than or equal to 1.25.

2. The reflective mask of claim 1, wherein the first stack of multiple layers further comprises:
a second absorber layer over the first capping layer and spaced apart from the first absorber layer by a first trench; and
a second protection layer disposed directly on a top surface of the second absorber layer,
wherein the second absorber layer comprises the first material, and the second protection layer comprises the second material.

3. The reflective mask of claim 2, further comprising:
a second stack of multiple layers comprising:
a second reflective multilayer disposed over the substrate;
a second capping layer disposed over the second reflective multilayer; and
a third absorber layer disposed over the second capping layer,
wherein the first stack of multiple layers is spaced apart from the second stack of multiple layers by a second trench.

4. The reflective mask of claim 3, wherein a depth of the second trench is greater than a depth of the first trench.

5. The reflective mask of claim 1, wherein a nitrogen concentration of the second material is greater than a nitrogen concentration of the first material.

6. The reflective mask of claim 1, wherein the first material comprises tantalum boride.

7. The reflective mask of claim 1, further comprising:
a second protection layer extending along a sidewall surface of the first absorber layer and includes the second material.

8. The reflective mask of claim 7, wherein a nitrogen concentration of the second protection layer is less than a nitrogen concentration of the first protection layer.

9. The reflective mask of claim 7, wherein a thickness of the second protection layer is less than a thickness of the first protection layer.

10. A reflective mask, comprising:
a substrate comprising a front side and a back side;
a conductive film on the back side of the substrate;
a reflective multilayer over the front side of the substrate;
a capping layer over the reflective multilayer;
an absorber layer over the capping layer and comprising a top surface, wherein the absorber layer comprises tantalum boride; and
a protection layer in direct contact with the top surface of the absorber layer,
wherein a nitrogen concentration of the protection layer is greater than a nitrogen concentration of the absorber layer.

11. The reflective mask of claim 10, wherein a ratio of nitrogen to tantalum (N/Ta) in the protection layer is greater than or equal to 1.25.

12. The reflective mask of claim 10, wherein the protection layer is less easily to be oxidized than the absorber layer.

13. The reflective mask of claim 10, wherein the protection layer comprises a flat portion disposed directly on the absorber layer.

14. The reflective mask of claim 13, wherein the protection layer comprises a vertical portion extending along a sidewall surface of the absorber layer.

15. The reflective mask of claim 10, further comprising:
another reflective multilayer over the front side of the substrate and spaced apart from the reflective multilayer by a trench;
another capping layer over the another reflective multilayer;
another absorber layer over the another capping layer; and
another protection layer in direct contact with the top surface of the another absorber layer.

16. A reflective mask, comprising:
a reflective multilayer disposed over a front side of a substrate;
a capping layer disposed over the reflective multilayer;
an absorber layer disposed over the capping layer and comprising a top surface and a sidewall surface; and
a protection layer comprises a first portion extending along the top surface of the absorber layer and a second portion extending along the sidewall surface of the absorber layer, and the second portion is spaced apart from the reflective multilayer by the capping layer,
wherein the absorber layer is formed of a first material and the protection layer is formed of a second material that is less easily to be oxidized than the first material.

17. The reflective mask of claim 16, wherein a nitrogen concentration of the protection layer is greater than a nitrogen concentration of the absorber layer.

18. The reflective mask of claim 16, wherein the absorber layer comprises tantalum boride.

19. The reflective mask of claim 16, wherein a ratio of nitrogen to tantalum (N/Ta) in the protection layer is greater than or equal to 1.25.

20. The reflective mask of claim 16, wherein a fluorine concentration of the protection layer is greater than a fluorine concentration of the absorber layer.

* * * * *